United States Patent
Ichikawa et al.

(10) Patent No.: US 12,364,058 B2
(45) Date of Patent: Jul. 15, 2025

(54) NEAR-INFRARED LIGHT EMITTING SEMICONDUCTOR ELEMENT AND METHOD FOR MANUFACTURING SAME

(71) Applicant: OSAKA UNIVERSITY, Suita (JP)

(72) Inventors: Shuhei Ichikawa, Suita (JP); Naoki Yoshioka, Suita (JP); Yasufumi Fujiwara, Suita (JP); Jun Tatebayashi, Suita (JP)

(73) Assignee: THE RITSUMEIKAN TRUST, Kyoto (JP)

( * ) Notice: Subject to any disclaimer, the term of this patent is extended or adjusted under 35 U.S.C. 154(b) by 472 days.

(21) Appl. No.: 17/682,093

(22) Filed: Feb. 28, 2022

(65) Prior Publication Data

US 2022/0278249 A1 Sep. 1, 2022

Related U.S. Application Data

(63) Continuation of application No. PCT/JP2020/030790, filed on Aug. 13, 2020.

(30) Foreign Application Priority Data

Sep. 3, 2019 (JP) .................................. 2019-160339

(51) Int. Cl.
*H10H 20/01* (2025.01)
*C23C 16/18* (2006.01)
(Continued)

(52) U.S. Cl.
CPC ....... *H10H 20/01335* (2025.01); *C23C 16/18* (2013.01); *C23C 16/303* (2013.01);
(Continued)

(58) Field of Classification Search
CPC ............... H01L 33/007; H01L 21/0242; H01L 21/02458; H01L 21/02505; H01L 21/0254;
(Continued)

(56) References Cited

U.S. PATENT DOCUMENTS

6,140,669 A * 10/2000 Lozykowski .......... C09K 11/77
257/103
6,277,664 B1 8/2001 Lozykowski et al.
(Continued)

FOREIGN PATENT DOCUMENTS

| CN | 110036144 A | 7/2019 |
| JP | 2002-537647 A | 11/2002 |

(Continued)

OTHER PUBLICATIONS

English translation of Japanese Office Action for Japanese Application No. 2021-543677, dated Aug. 28, 2020.

(Continued)

*Primary Examiner* — Mohammad A Rahman
(74) *Attorney, Agent, or Firm* — Birch, Stewart, Kolasch & Birch, LLP

(57) ABSTRACT

Provided are: a near infrared light-emitting semiconductor element that does not contain any harmful elements and that makes it possible to obtain near infrared light of a stable wavelength in a narrow band regardless of the operating environment; and a method for producing the near infrared light-emitting semiconductor element. GaN is used in the method for producing a near infrared light-emitting semiconductor element, and an active layer added in order to substitute Tm with Ga is formed on GaN in a reaction container at a growth rate of 0.1-30 μm/h without removal from said reaction container using an organometallic vapor phase growth method under temperature conditions of 600-

(Continued)

1400° C. in a series of formation steps including formation of a p-type layer and an n-type layer. GaN is used in the near infrared light-emitting semiconductor element, and said near infrared light-emitting semiconductor element includes an active layer sandwiched between an n-type layer and a p-type layer on a substrate. An organometallic vapor phase growth method is used to add the active layer to the GaN in order to substitute Tm with Ga.

12 Claims, 12 Drawing Sheets

(51) Int. Cl.
  C23C 16/30 (2006.01)
  H01L 21/02 (2006.01)
  H10H 20/825 (2025.01)
(52) U.S. Cl.
  CPC .... H01L 21/0242 (2013.01); H01L 21/02458 (2013.01); H01L 21/02505 (2013.01); H01L 21/0254 (2013.01); H01L 21/02579 (2013.01); H01L 21/02581 (2013.01); H01L 21/0262 (2013.01); H10H 20/0137 (2025.01); H10H 20/825 (2025.01)
(58) Field of Classification Search
  CPC ......... H01L 21/02579; H01L 21/02581; H01L 21/0262; H01L 33/0075; H01L 33/32; H01L 33/325; C23C 16/18; C23C 16/303; C23C 16/52; C23C 16/34; C30B 25/02; C30B 29/406; C30B 29/68
  See application file for complete search history.

(56) References Cited

U.S. PATENT DOCUMENTS

| 2006/0040445 | A1 | 2/2006 | Lee et al. |
| 2010/0320443 | A1* | 12/2010 | Jiang ............... B82Y 20/00 257/14 |
| 2019/0280156 | A1* | 9/2019 | Fujiwara ............ C23C 16/303 |
| 2020/0266233 | A1* | 8/2020 | Iguchi ................ H01L 33/06 |
| 2021/0061833 | A1 | 3/2021 | Dussarrat et al. |

FOREIGN PATENT DOCUMENTS

| JP | 2008-60234 A | | 3/2006 |
| JP | 2009-043807 A | * | 8/2007 |
| JP | 2009-43807 A | | 2/2009 |
| JP | 2012-19929 A | | 2/2012 |
| JP | 2014-18478 A | | 2/2014 |
| JP | 2019-134154 A | | 8/2019 |
| WO | WO 00/49635 A1 | | 8/2000 |
| WO | WO 2018/097102 A1 | | 5/2018 |

OTHER PUBLICATIONS

Rodrigues et al., "Spectroscopic Analysis of the NIR Emission in Tm Implanted $Al_xGa_{1-x}N$ Layers", Journal of Applied Physics, vol. 120, 2016, pp. 081701 (13 pages total).

International Search Report (PCT/ISA/210) issued in PCT/JP2020/030790 mailed on Nov. 10, 2020.

Written Opinion (PCT/ISA/237) issued in PCT/JP2020/030790 mailed on Nov. 10, 2020.

Taiwanese Office Action and Search Report for Taiwanese Application No. 109129147, dated Jan. 6, 2025, with English translation.

* cited by examiner

[Fig. 1]
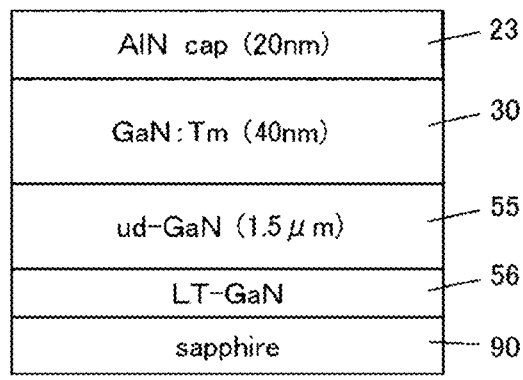
[Fig. 2]
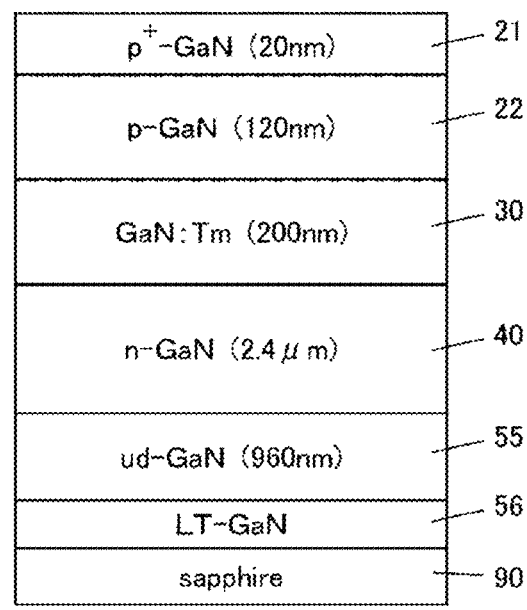

[Fig. 3]
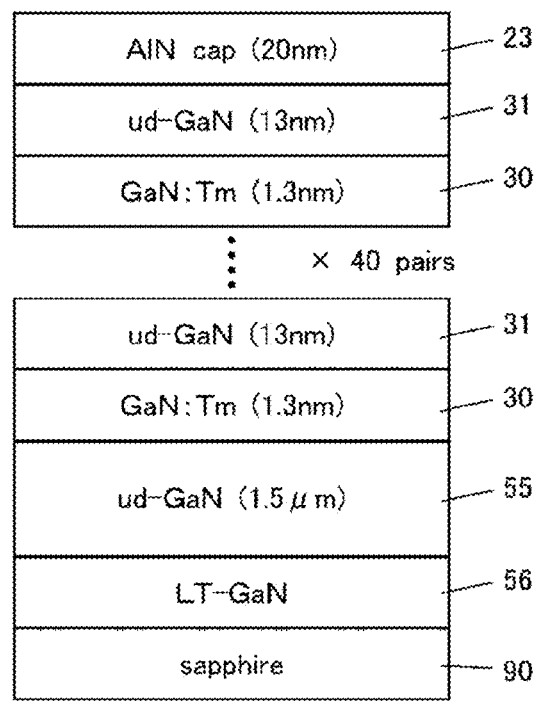
[Fig. 4]
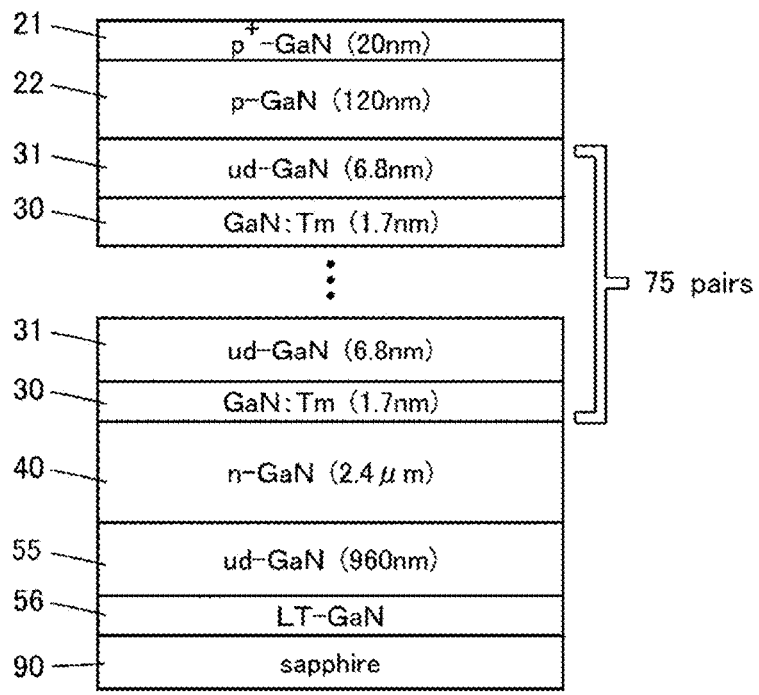

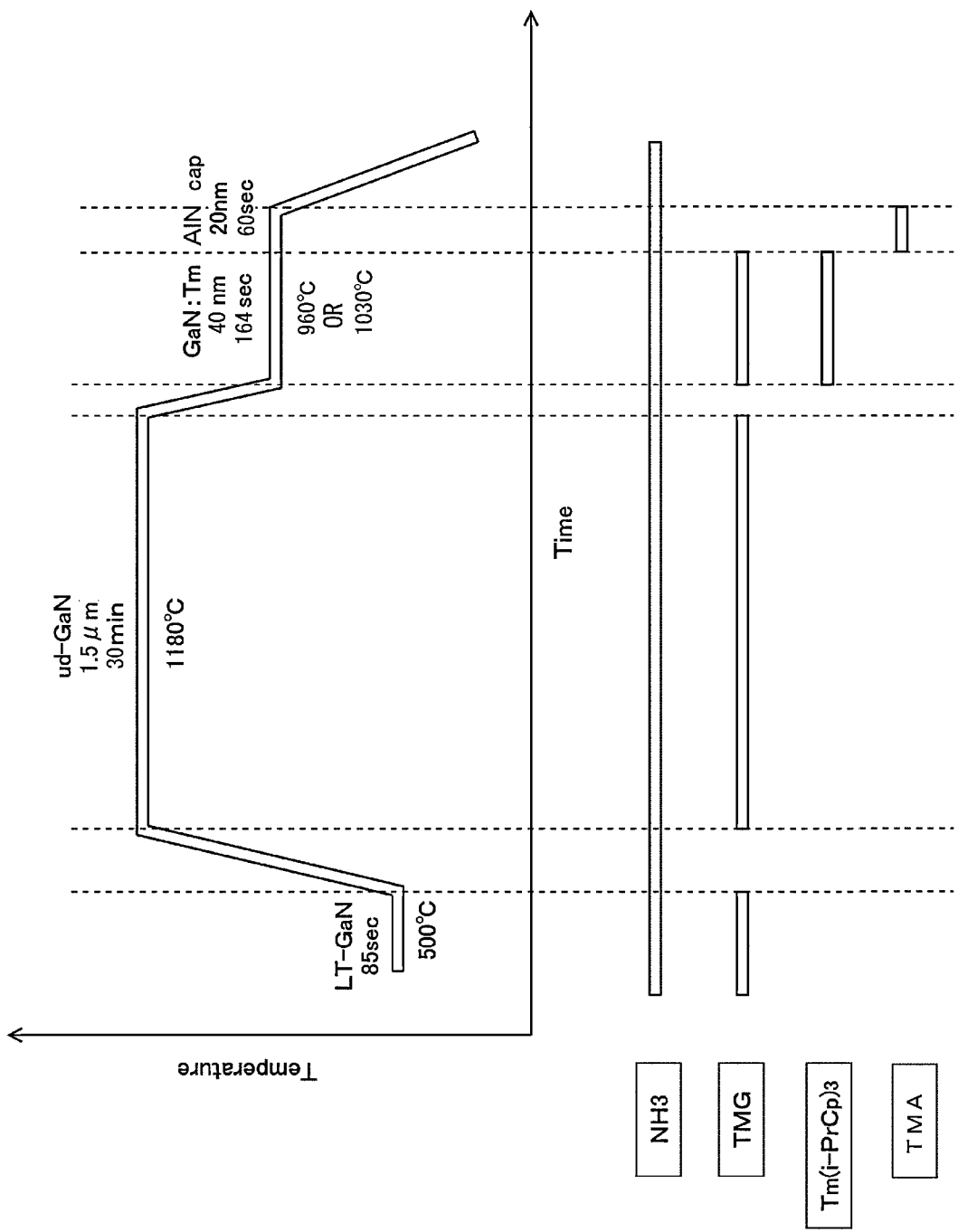
[Fig. 5]

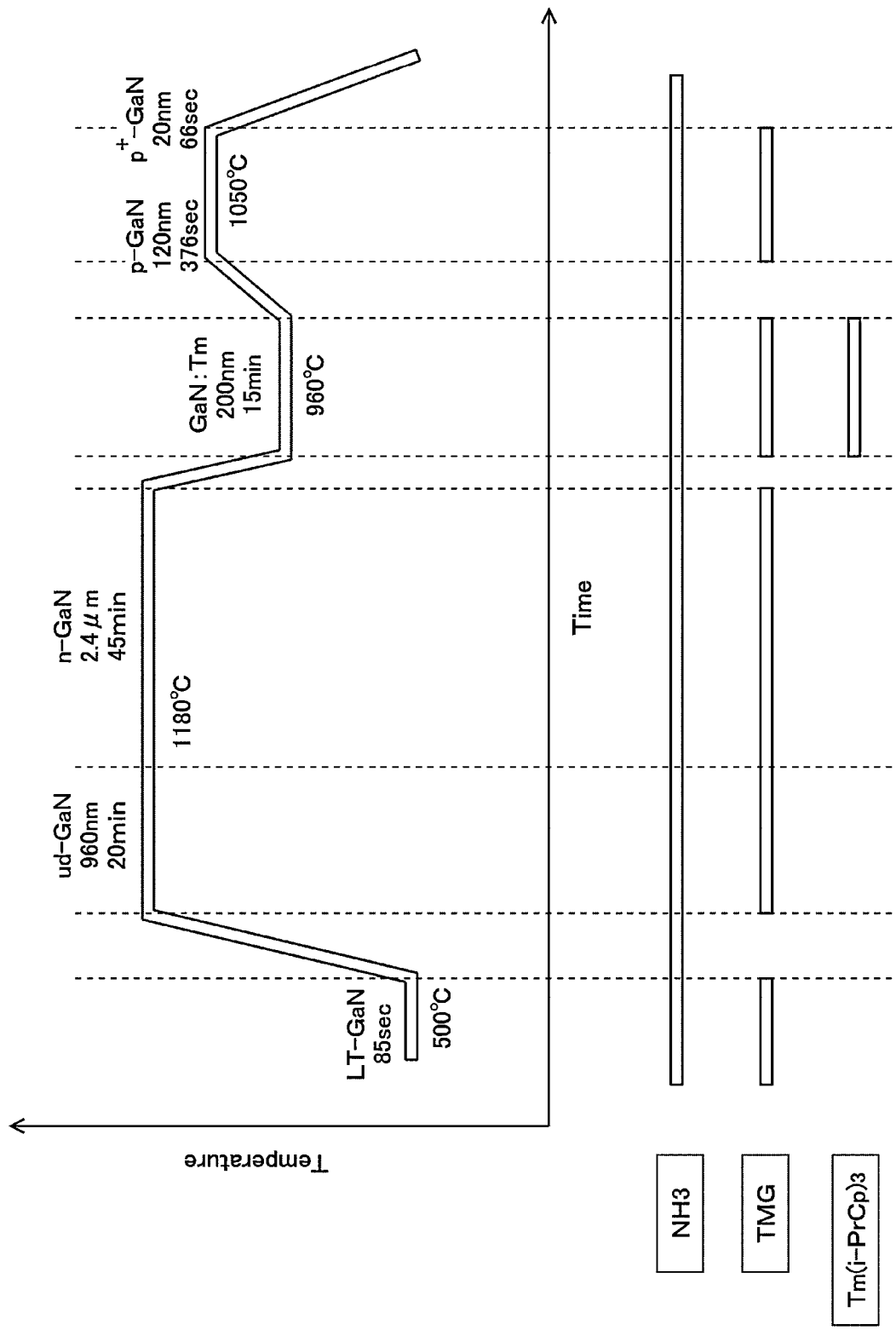
[Fig. 6]

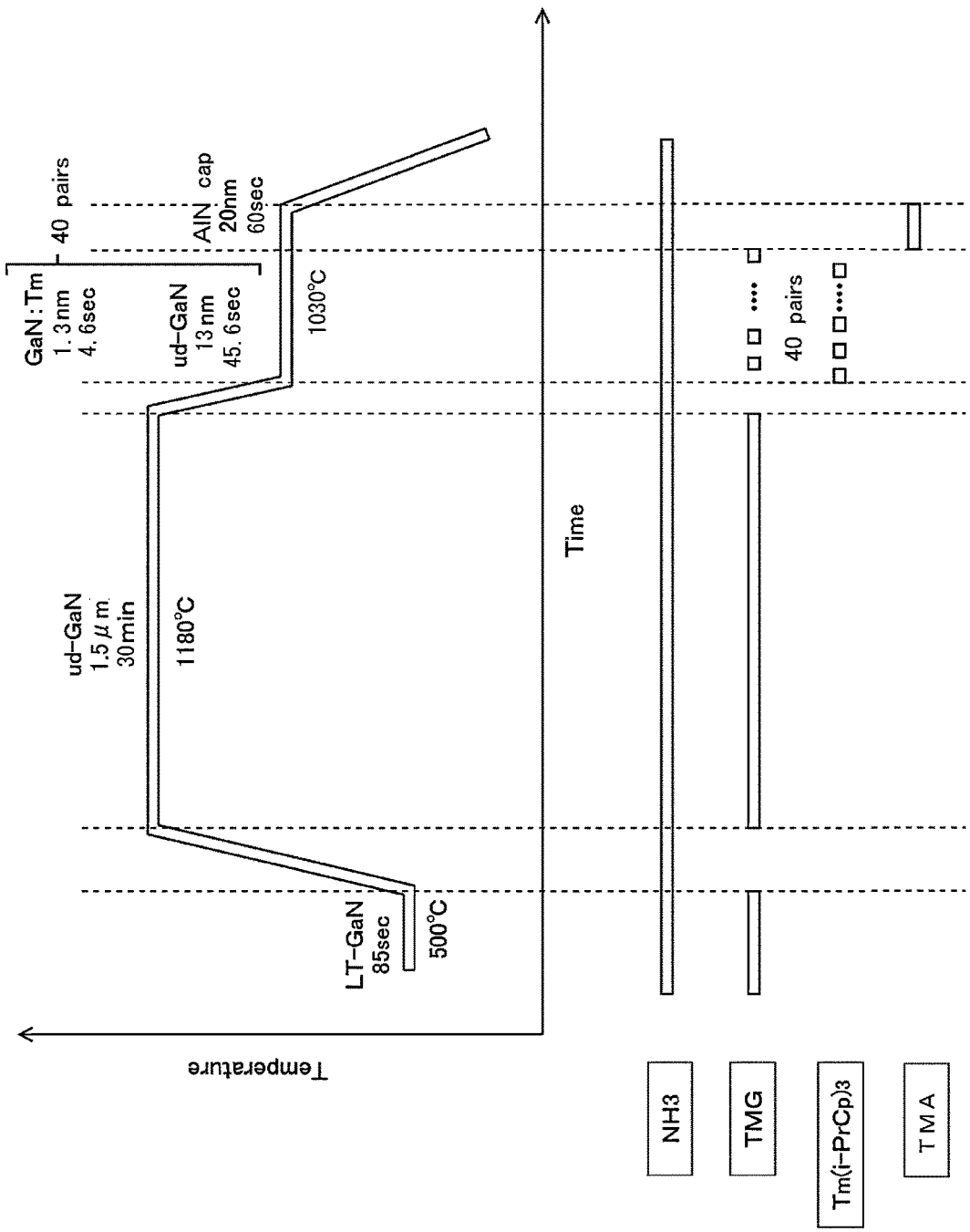
[Fig. 7]

[Fig. 8]
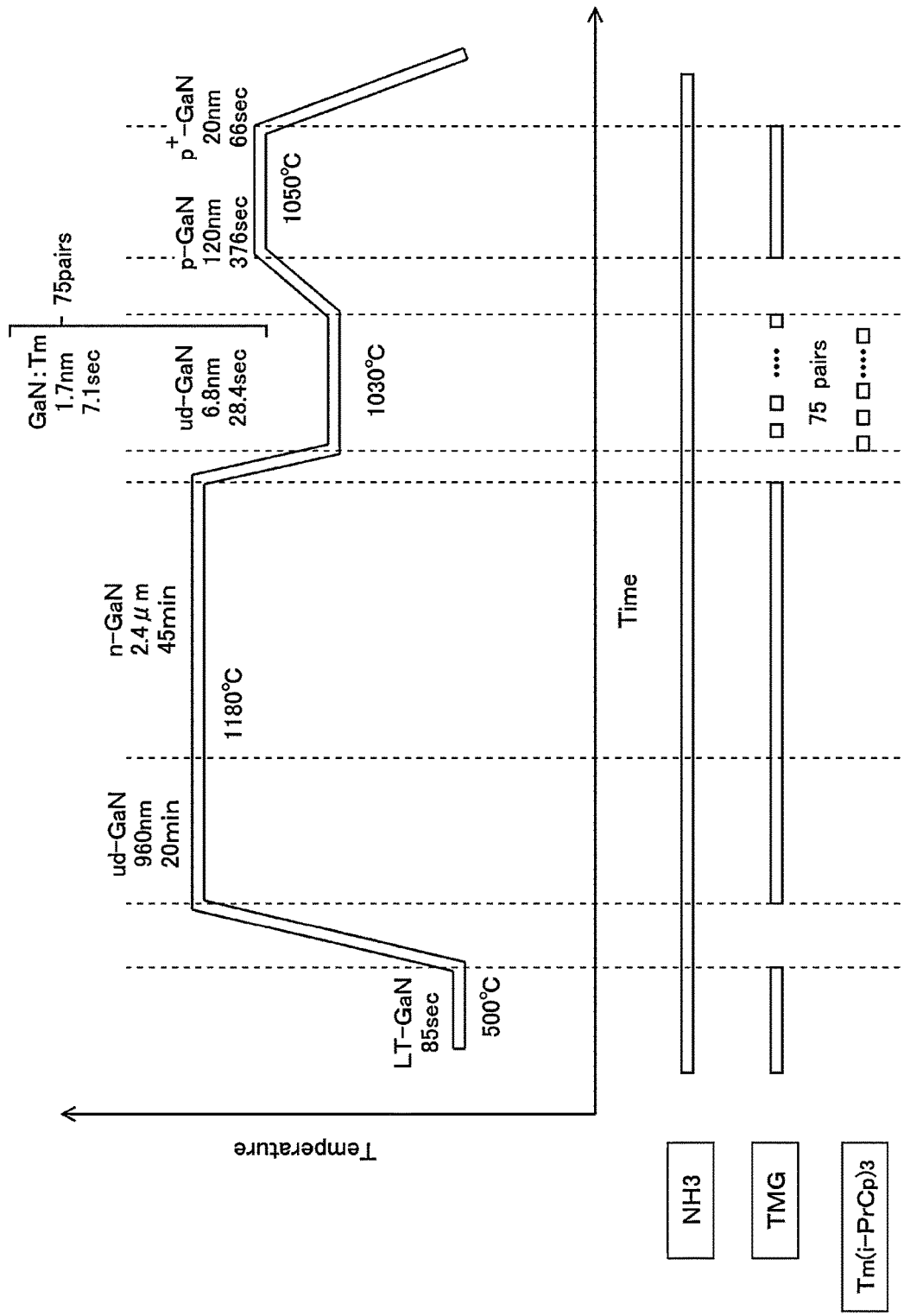

[Fig. 9]
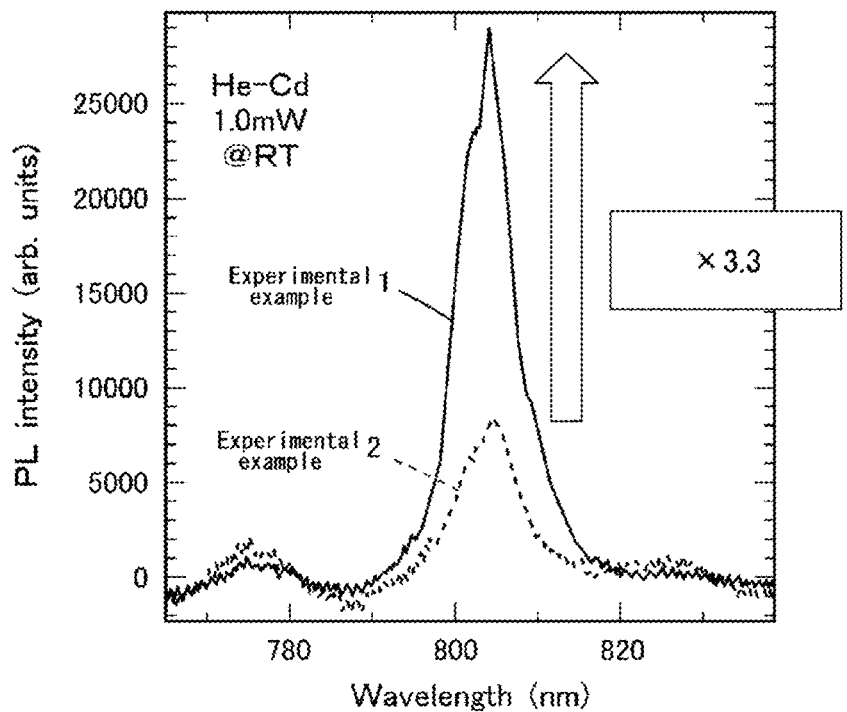
[Fig. 10]
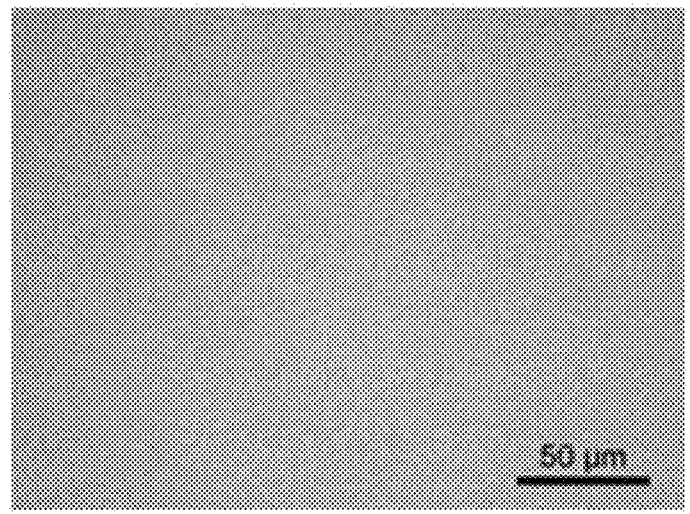

[Fig. 11]
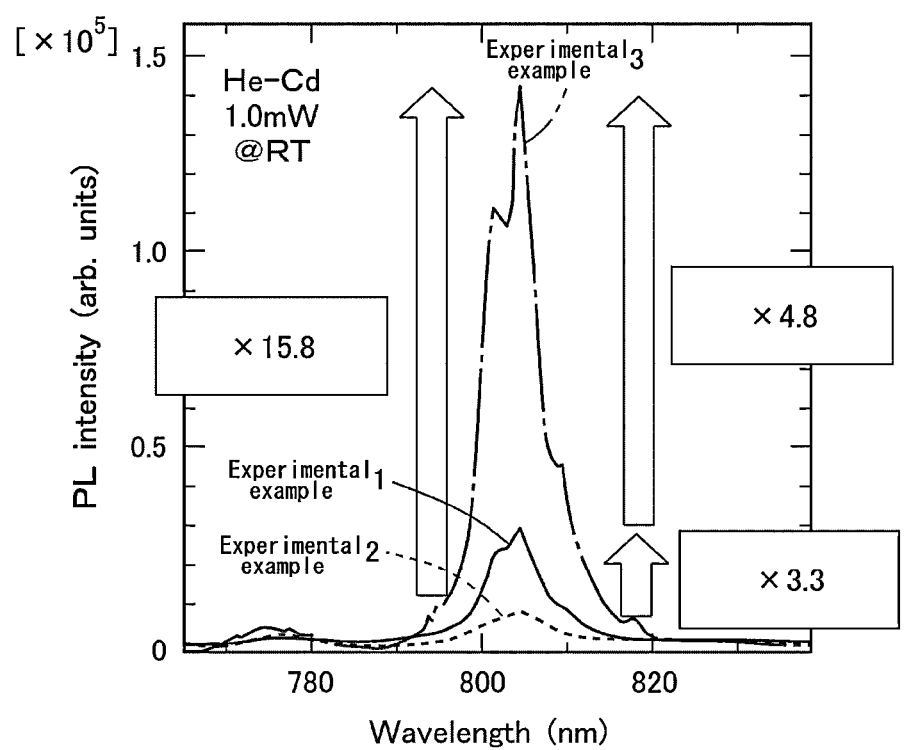

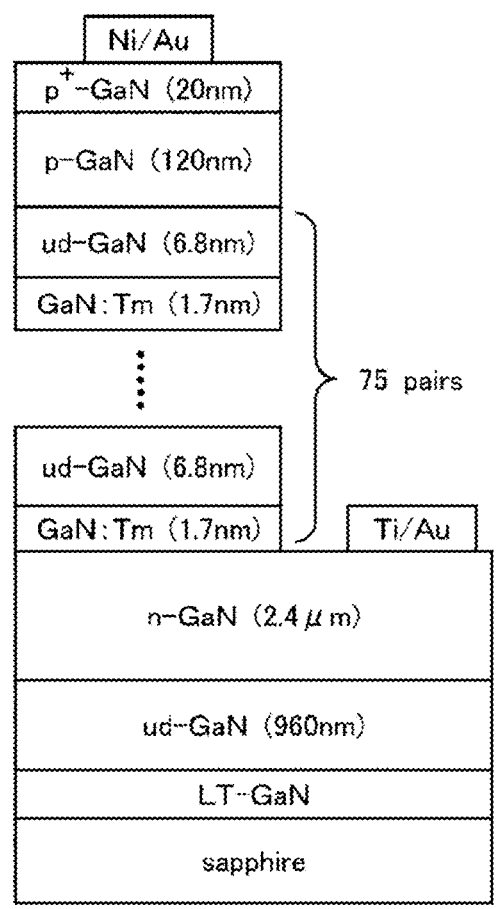
[Fig. 12]

[Fig. 13]
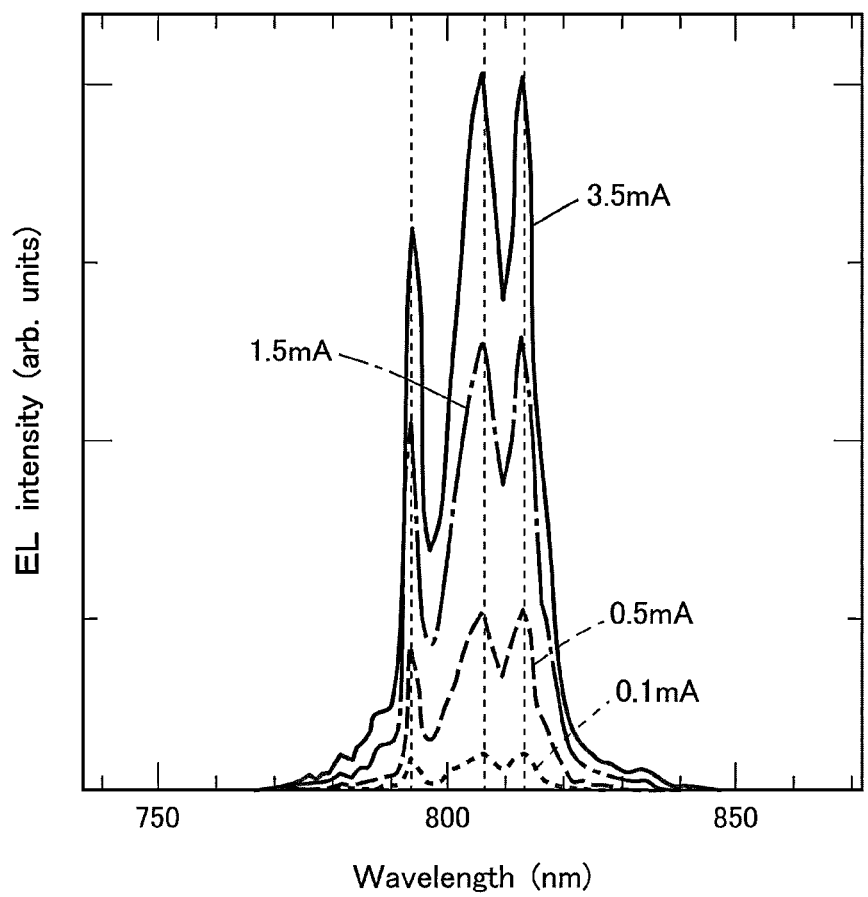

[Fig. 14]
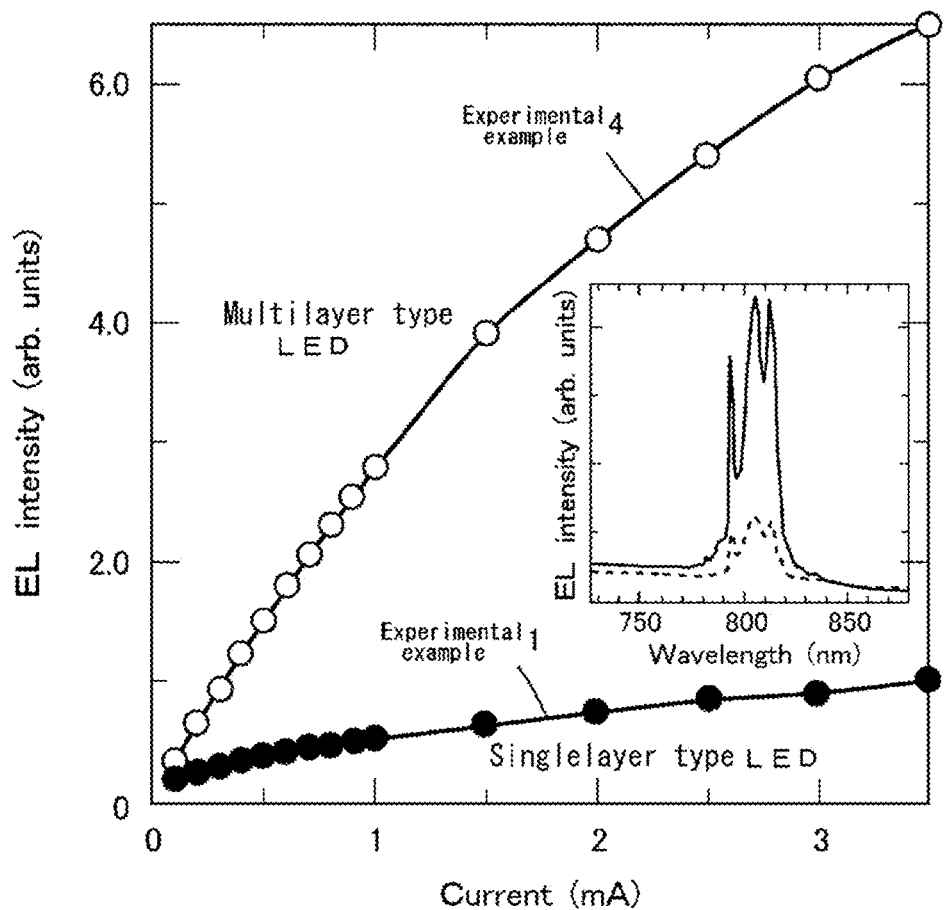
[Fig. 15]
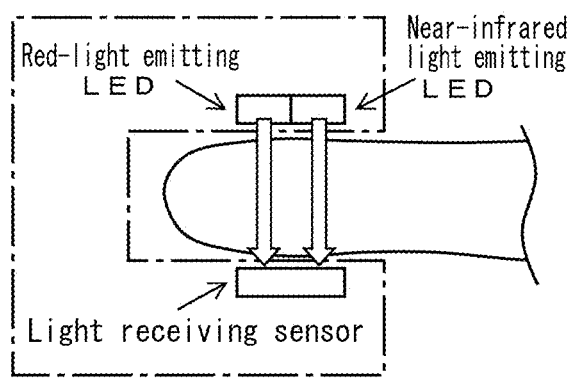

[Fig. 16]
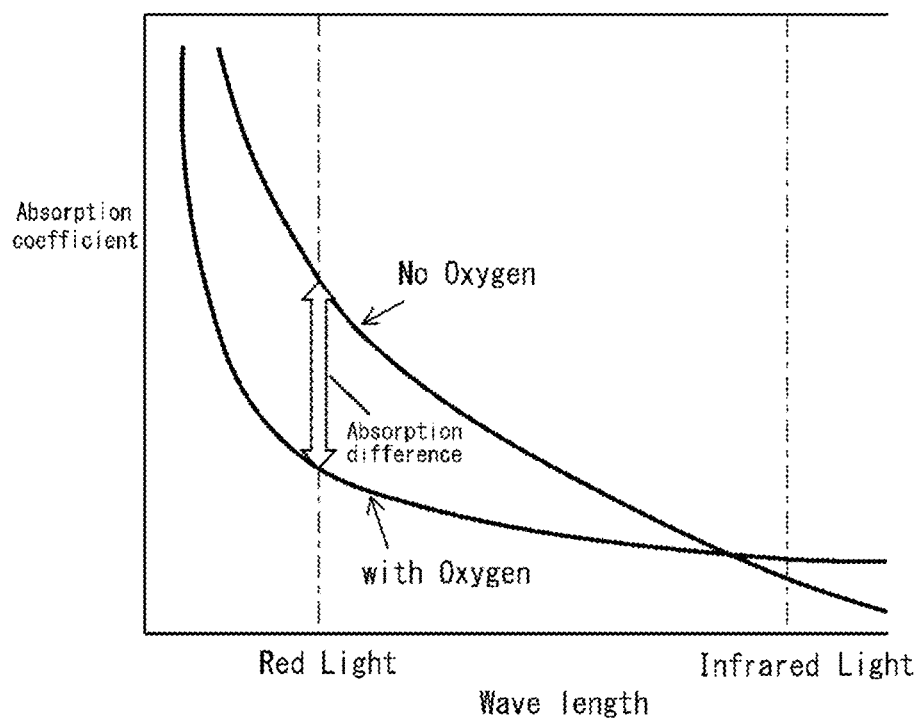

NEAR-INFRARED LIGHT EMITTING SEMICONDUCTOR ELEMENT AND METHOD FOR MANUFACTURING SAME

CROSS REFERENCE TO RELATED APPLICATIONS

This application is a Continuation of PCT International Application No. PCT/JP2020/030790, filed on Aug. 13, 2020, which claims priority under 35 U.S.C. 119(a) to Patent Application No. 2019-160339, filed in Japan on Sep. 3, 2019, all of which are hereby expressly incorporated by reference into the present application.

TECHNICAL FIELD

The present invention relates to a near-infrared light emitting semiconductor element and a method for manufacturing the same.

BACKGROUND ART

The near-infrared wavelength range of 650 to 950 nm easily penetrates living tissues, water, fat, etc., and makes it possible to observe the reaction occurring in the living body as it is. Hence, it is also called "window of living body", and is expected to be applied to bioimaging and pulse oximeter, PDT (Photodynamic therapy) and the like (for example, Patent Documents 1 and 2).

Currently, development of light emitting elements (light emitting semiconductor elements, semiconductor devices, semiconductor LEDs, laser diodes, etc.), that emit light in the near infrared region, is progressing centering on GaAs-based devices in which an AlGaAs layer or an AlGaInP layer is provided as a light emitting layer on a GaAs substrate.

However, since the near-infrared light emitting device using a GaAs-based material emits light by transition between bands, there is a problem that the light emitting wavelength changes greatly depending on the operating environment such as the injection current and the operating temperature, and the light emission is not stable. Further, since the light emission is broad light emission, there is also a problem that a reading error may occur at the time of measurement or the like.

Furthermore, since As and P contained in GaAs-based materials are harmful elements, there is a strong demand for environment-friendly near-infrared light emitting elements that do not contain these harmful elements due to the growing environmental awareness in recent years.

PRIOR ART DOCUMENT

Patent Document

Patent Document 1: JP-A-2014-018478
Patent Document 2: JP-A-2012-019929

SUMMARY OF THE INVENTION

Problems to be Solved by the Invention

In view of the above problems, the present invention is to provide a near-infrared light-emitting semiconductor element not containing harmful elements and can obtain near-infrared light emission with stable wavelength regardless of the operating environment in a narrow band and a method for manufacturing the same.

Means for Solving Problems

As a result of intensive studies, the present inventor has found that the above problems can be solved by the inventions shown in the following claims, and has completed the present invention.

The invention according to claim 1 is;
a method for manufacturing a near-infrared light emitting semiconductor element, wherein
an active layer obtained by adding Tm to replace the Ga in GaN by supplying Tm(i-PrCp)$_3$ and controlling the substitution site of Tm$^{3+}$ ion so that it is in the Ga site and its immediate vicinity is formed at a growth rate of 1 to 30 µm/h in a reaction vessel without removing it from the reaction vessel, using a metal organic chemical vapor deposition, under the temperature condition of 600-1400° C., in a series of forming steps of a p-type layer and an n-type layer.

The invention according to claim 2 is
the method for manufacturing a near-infrared light emitting semiconductor element according to claim 1, wherein the amount of Tm added is $1\times10^{12}$ to $1\times10^{23}$ cm$^{-3}$.

The invention according to claim 3 is
the method for manufacturing a near-infrared light emitting semiconductor element according to claim 1 or 2, wherein the active layer is formed by stacking a plurality of the Tm-added GaN layer and the Tm-free GaN layer as a pair.

The invention according to claim 4 is
the method for manufacturing a near-infrared light emitting semiconductor element according to any one of claims 1 to 3, wherein the growth pressure of the active layer in the metal organic chemical vapor deposition exceeds 0.01 kPa and is less than 300 kPa.

The invention according to claim 5 is
the method for manufacturing a near-infrared light emitting semiconductor element according to any one of claims 1 to 4, wherein the flow rate of the carrier gas in the metal organic chemical vapor deposition used for forming the active layer is 10 to 300 SLM.

The invention according to claim 6 is
a near-infrared light emitting semiconductor element which uses GaN and emits light by current injection, and which has an active layer sandwiched between an n-type layer and a p-type layer on a substrate, wherein the active layer is obtained by adding Tm to replace the Ga in GaN by using a metal organic chemical vapor deposition.

The invention according to claim 7 is
the near-infrared light emitting semiconductor element according to claim 6, wherein the amount of Tm added to the active layer is $1\times10^{12}$ to $1\times10^{23}$ cm$^{-3}$.

The invention according to claim 8 is
the near-infrared light emitting semiconductor element according to claim 6 or 7, wherein the active layer is formed by stacking a plurality of the Tm-added GaN layer and the Tm-free GaN layer as a pair.

Effect of the Invention

According to the present invention, it is possible to provide a near-infrared light emitting semiconductor element which does not contain harmful elements and can obtain near-infrared light emission having a stable wavelength regardless of the operating environment in a narrow band, and a method for manufacturing the same.

BRIEF DESCRIPTION OF THE DRAWINGS

FIG. 1 A figure showing the basic structure of an example of a Tm-added GaN film for producing a single-layer type LED according to an embodiment of the present invention FIG. 2 A figure showing the basic structure of an example of a single-layer type LED according to an embodiment of the present invention FIG. 3 A figure showing the basic structure of an example of a Tm-added GaN film for producing a multilayer type LED according to an embodiment of the present invention FIG. 4 A figure showing the basic structure of an example of a multilayer type LED according to an embodiment of the present invention.

FIG. 5 A diagram showing a recipe for producing the Tm-added GaN film shown in FIG. 1

FIG. 6 A diagram showing a recipe for producing the single-layer type LED shown in FIG. 2

FIG. 7 A diagram showing a recipe for producing the Tm-added GaN film shown in FIG. 3

FIG. 8 A diagram showing a recipe for producing the multilayer type LED shown in FIG. 4

FIG. 9 A figure showing results of PL measurement of a single-layer type LED

FIG. 10 A nomalski microscope image of the surface of the active layer of the single-layer type LED shown in Experimental Example 1

FIG. 11 A figure showing results of PL measurement of a single-layer type LED and a multi-layer type LED FIG. 12 A figure showing a configuration of a multi-layer type LED in a mounting mode FIG. 13 A figure showing results of EL measurement of a multilayer type LED in a mounting mode FIG. 14 A figure showing a comparison of EL measurement results of a multilayer type LED and a single-layer type LED FIG. 15 A figure for illustrating the measurement of blood oxygen concentration with a pulse oximeter FIG. 16 A figure for illustrating the measurement of blood oxygen concentration with a pulse oximeter

EMBODIMENT FOR CARRYING OUT THE INVENTION

[1] Basic Concept of the Present Invention

Before entering the description of specific embodiments, the basic idea of the present invention will be described together with the background of the examination.

As described above, the near-infrared light emitting element using the conventional GaAs-based material has a problem that the light emission is not stable because the light is emitted by the transition between bands.

The present inventors, for the first in the world, have formed a light-emitting semiconductor element by providing an active layer in which Eu is added to a GaN-based base material between an n-type layer and a p-type layer, and thereby have succeeded in producing a red-light emitting semiconductor element capable of stable red-light emission with a peak in the vicinity of 621 nm through an Eu ion transition in the 4f shell (see JP-B-5388041 and JP-B-6450061).

In the study of manufacturing this red-light emitting semiconductor element, the present inventors have considered that, theoretically, when another rare earth element instead of Eu is added to GaN, a light emitting element having a wavelength different from that of red can be realized, and have conducted further experiments and studies.

As a result, it was found for the first time in the world that a semiconductor element having an active layer in which Tm is added to GaN as a rare earth element emits near-infrared light in a narrow band near 800 nm by $Tm^{3+}$ ions. Thus the present invention has been completed.

That is, though a light-emitting semiconductor element in which Tm is added to a GaN-based material has been studied so far, the study is limited to a blue light-emitting semiconductor element in which Tm is added to AlGaN and emits light at around 460 nm. There has been no report that it could be applied to infrared light emitting semiconductor elements.

However, the present inventors considered that, if the Ga substitution site of Tm is carefully controlled, it may emit light in the near infrared region, and have repeated experiments and studies. As a result, by controlling the substitution site of $Tm^{3+}$ ion so that it is in the Ga site and its immediate vicinity, near-infrared emission dominated by the peak around 800 nm, which is the emission caused by $Tm^{3+}$ ions, became possible, and near-infrared emission with a stable wavelength in a narrow band could be obtained with sufficient luminous efficiency.

The emission of rare earth ions associated with the transition in the 4f shell shows extremely high wavelength stability in a narrow band, so that stable emission under a certain wavelength becomes possible which is not affected by the injection current or the operating temperature, and sufficient luminous efficiency can be obtained.

Since such a Tm-added near-infrared light emitting semiconductor element does not use harmful elements such as As and P, it is environmentally friendly and can be preferably used as a medical device embedded in a living body.

[2] Basic Embodiment of the Present Invention

First, a basic embodiment of the present invention will be described.

In the present embodiment, the near-infrared light emitting semiconductor element is manufactured by using a metal organic chemical vapor deposition (OMVPE, MOCVD). That is, in forming the active layer, under certain conditions such as a predetermined growth temperature, the metal organic chemical vapor deposition is used, and the addition of Tm is appropriately controlled so that the substitution site of $Tm^{3+}$ ion becomes the Ga site and its immediate vicinity. As a result, the surface of the semiconductor and the crystals in the vicinity thereof are not damaged, and a good pn junction can be formed.

A light emitting semiconductor element having such a good pn junction can inject, through an ohmic electrode, holes from the p-type layer and electrons from the n-type layer into the active layer by applying a low voltage of about several V. The energy of the injected holes and electrons excites $Tm^{3+}$ ions, and the energy emitted by the excited $Tm^{3+}$ ions to return to the ground state emits near-infrared light.

In order to obtain the excellent performance of the near-infrared light emitting semiconductor element, the growth temperature in the metal organic chemical vapor deposition (MOCVD) used for forming the active layer is controlled to 600 to 1400° C.

When the temperature is lower than 600° C., the thermal diffusion of atoms on the substrate is insufficient, so that $Tm^{3+}$ ions having a crystal field different from that of GaN increase, and the luminous intensity around 800 nm decreases. On the other hand, when the temperature exceeds 1400° C., $Tm^{3+}$ ions are desorbed from the surface of the crystal, making it difficult to add Tm to the GaN crystal. A more preferable temperature is 800 to 1200° C.

Then, in order to obtain a good pn junction, a p-type layer, an active layer and an n-type layer are formed in a series of forming steps.

That is, in forming the p-type layer, the active layer and the n-type layer, the p-type layer, the active layer and the n-type layer are sequentially formed in the reaction vessel without being taken out from the reaction vessel in the middle (regardless of before and after the order of p-type layer and n-type layer), and there is no interface state between the layers, carriers can be efficiently injected, and low voltage operation becomes possible.

It is preferable that the n-type layer and the p-type layer are also formed by the metal organic chemical vapor deposition (MOCVD) as in the formation of the active layer, but other growth methods are not excluded.

Further, since the near-infrared light emitting semiconductor element in the present embodiment has basically the same structure as the conventional nitride blue light emitting semiconductor element the existing manufacturing equipment for nitride blue light emitting semiconductor element can be used, only by changing the additive material, and the cost can be reduced in the production of the near infrared light emitting element.

The growth rate of the active layer is controlled to 0.1 to 30 µm/h. This makes it possible to epitaxially grow GaN to which Tm is added stably. A more preferable range is 0.1 to 3 µm/h.

In addition to the above, in the present embodiment, it is preferable to satisfy the following conditions.

First, the flow rate of the carrier gas (for example, hydrogen gas) is preferably 10 to 300 SLM. As a result, even when the pressure atmosphere during growth of the active layer (GaN layer) increases, it is possible to secure a sufficient flow rate of the Tm raw material to add Tm, so that a sufficient Tm concentration is secured, and stable high-intensity light emission can be obtained.

Next, in order to efficiently add Tm in a substitution type to GaN using the metal organic chemical vapor deposition (MOCVD), it is necessary to control the thermal convection of the raw material gas in the reaction apparatus. Specifically, by controlling the growth pressure to exceed 0.01 kPa and less than 300 kPa, thermal convection on the surface of GaN can be controlled, uniform addition can be performed, a stable active layer can be epitaxially grown, and the flatness of the crystal surface can be ensured.

That is, when it is 0.01 kPa or less, the crystallinity of GaN, which is the base material, deteriorates, and the flatness of the crystal surface is impaired. On the other hand, if it is 300 kPa or more, it becomes difficult to keep the flow velocity constant during crystal growth, the non-uniformity of the Tm concentration increases, and the flatness of the crystal surface cannot be ensured.

If the flatness of the crystal surface is impaired, a good interface cannot be formed when the pn junction diode structure is manufactured, and thus the device performance is impaired. It is more preferably 10 to 100 kPa.

The amount of Tm added to the active layer is preferably $1\times10^{12}$ to $1\times10^{23}$ cm$^{-3}$. If it is less than $1\times10^{12}$ cm$^{-3}$, it is difficult to obtain high-luminance emission because the concentration is low. If it exceeds $1\times10^{23}$ cm$^{-3}$, Tm segregation occurs in the active layer, so that the luminous efficiency decreases.

Further, in the present embodiment, it is preferable that the active layer is formed by stacking a plurality of Tm-added GaN layers and Tm-free GaN layers as a pair. By adopting such a multi-layered structure, the wavelength can be further stabilized with respect to the injection current amount, and the light emission quality can be improved.

[3] Specific Embodiment

Next, specific embodiments will be described with reference to the drawings, but these are examples and are not limited.

1. Near Infrared Light Emitting Semiconductor Element

First, a near-infrared light emitting semiconductor element (hereinafter, also simply referred to as "LED") according to the present embodiment will be described. Since, as the light emitting semiconductor element according to the present embodiment, a single-layer type LED in which an active layer is formed of a single-layer Tm-added GaN layer (GaN:Tm layer), as shown in FIGS. 1 and 2, and, a multi-layer type LED in which a Tm-added GaN layer and a Tm-non-added GaN layer (ud-GaN layer) are stacked to form an active layer, as shown in FIGS. 3 and 4, can be considered, the following explanation will be divided into a single-layer type LED and multi-layer type LED. It should be noted that FIGS. 1 to 4 show the state of only the film before the electrodes are provided and formed on the LED, but for convenience of explanation, the case where the pn layer is not formed is also described as an LED.

(1) Single-Layer Type LED (a) First Single-Layer Type LED

A single-layer type LED manufactured by using the Tm-added GaN film shown in FIG. 1 is referred to as a first single-layer type LED, and the basic configuration of the Tm-added GaN film will be described. In FIG. 1, 23 is an AlN cap layer (thickness 20 nm), 30 is a GaN:Tm layer (thickness 40 nm), 55 is an ud-GaN (undoped GaN) layer (thickness 1.5 µm), 56 is an LT-GaN layer, and 90 is a sapphire substrate.

For the substrate, for example, a template is used. Specifically, a template in which a GaN layer such as an LT-GaN layer 56 or an ud-GaN layer 55 is formed on a sapphire substrate 90 is used as a substrate, and a light emitting layer, wherein GaN:Tm layer is used as an active layer, is formed on such a template.

In this Tm-added GaN film, one GaN:Tm layer 30 is formed as an active layer (light emitting layer) between the ud-GaN layer 55 and the AlN cap layer 23. As described above, the amount (content) of Tm added to the GaN:Tm layer 30 is preferably $1\times10^{12}$ to $1\times10^{23}$ cm$^{-3}$.

(b) Second Single-Layer Type LED

Next, the basic configuration of the single-layer type LED shown in FIG. 2, as the second single-layer type LED, will be described. In FIG. 2, 21 is a p$^+$-GaN layer (thickness 20 nm), 22 is a p-GaN layer (thickness 120 nm), 30 is a GaN:Tm layer (thickness 200 nm), 40 is an n-GaN layer (thickness 2.4 µm), 55 is an ud-GaN layer (thickness 960 nm), 56 is an LT-GaN layer, and 90 is a sapphire substrate.

In this single-layer type LED, one GaN:Tm layer 30 is formed as an active layer (light emitting layer) between the n-GaN layer 40 and the p-GaN layer 22.

(2) Multi-Layer Type LED (a) First Multilayer Type LED

Next, a multilayer type LED manufactured by using the Tm-added GaN film shown in FIG. 3 will be referred to as a third single-layer type LED, and the basic configuration of the Tm-added GaN film will be described. This Tm-added GaN film corresponds to the Tm-added GaN film shown in FIG. 1.

In FIG. 3, 23 is an AlN cap layer (thickness 20 nm), 31 is an ud-GaN layer (thickness 13 nm), 30 is a GaN:Tm layer (thickness 1.3 nm), 55 is an ud-GaN layer (thickness 1.5 µm), 56 is an LT-GaN layer and 90 is a sapphire substrate.

As shown in FIG. 3, in this Tm-added GaN film, the light emitting layer is formed by stacking 40 pairs consisting of a GaN:Tm layer 30 and an ud-GaN layer 31 (GaN:Tm/ud-GaN).

The thickness of each of the GaN:Tm layer and the ud-GaN layer is appropriately set according to the layer thickness of the active layer and the number of pairs.

As described above, by forming the active layer in a stacked structure, the wavelength can be further stabilized with respect to the injection current amount, and the light emission quality can be improved.

(b) Second Multi-Layer Type LED

Next, the basic configuration of the multi-layer type LED shown in FIG. 4, as the second multi-layer type LED, will be described. The multi-layer type LED corresponds to the single-layer type LED shown in FIG. 2.

In FIG. 4, 21 is a p$^+$-GaN layer (thickness 20 nm), 22 is a p-GaN layer (thickness 120 nm), 31 is an ud-GaN layer (thickness 6.8 nm), 30 is a GaN:Tm layer (thickness 1.7 nm), 40 is an n-GaN layer (thickness 2.4 µm), 55 is an ud-GaN layer (thickness 960 nm), 56 is an LT-GaN layer, and 90 is a sapphire substrate.

As shown in FIG. 4, in this multi-layer type LED, the light emitting layer is formed by stacking 75 pairs consisting of a GaN:Tm layer 30 and an ud-GaN layer 31 (GaN:Tm/ud-GaN).

2. Method for Manufacturing Near-Infrared Light Emitting Semiconductor Element

Next, a method for manufacturing a near-infrared light emitting semiconductor element according to the present embodiment will be described separately for a single-layer type LED and a multi-layer type LED.

(1) Method for Manufacturing Single-Layer Type LED (A) First Single-Layer Type LED First, a method for manufacturing the Tm-added GaN film shown in FIG. 1 will be described. FIG. 5 is a recipe for producing a Tm-added GaN film shown in FIG. 1. The production is conducted in a series of steps without taking out the sample from the reaction tube in the middle and without interrupting the growth by using a metal organic chemical vapor deposition (MOCVD, OMVPE). In FIG. 5, the upper row shows the relationship between temperature and time, and the lower row shows the supply status of each raw material.

(a) Formation of LT-GaN Layer

First, an LT-GaN layer is formed on the sapphire substrate in order to prevent the occurrence of cracks due to the difference in the lattice constants of sapphire and GaN.

Specifically, $NH_3$ as an N raw material and TMG as a Ga raw material are supplied on a sapphire substrate arranged in the reaction vessel at 500° C. for 85 seconds to form an LT-GaN layer.

(b) Formation of Ud-GaN Layer

Next, the ud-GaN layer is formed in order to increase the distance between the sapphire substrate and the n-GaN layer formed in the next step and suppress the influence of dislocations.

Specifically, first, the temperature is raised to 1180° C. During this period, only $NH_3$ is supplied.

Next, while maintaining the temperature at 1180° C., $NH_3$ and TMG are supplied for 30 minutes to form an ud-GaN layer (thickness 1.5 µm) on the LT-GaN layer.

(c) GaN: Formation of Tm Layer

Next, a GaN:Tm layer to be an active layer is formed. Specifically, first, the temperature is lowered to 960° C. or 1030° C. During this period, only $NH_3$ is supplied.

Next, while maintaining this temperature, $NH_3$, TMG, and Tm(i-PrCp)$_3$, which is a raw material for Tm, were supplied for 164 seconds to form a GaN:Tm layer (thickness 40 nm) on the ud-GaN layer.

(d) Formation of AlN Cap Layer

Next, an AlN cap layer is formed for protection of the GaN:Tm layer and good light transmission for a He—Cd laser described later or the like.

Specifically, while maintaining the temperature of 960° C. or 1030° C., $NH_3$ and TMA, which is an Al raw material, are supplied for 60 seconds to form an AlN cap layer (thickness 20 nm) on the GaN:Tm layer.

(B) Second Single-Layer Type LED

Next, a method for manufacturing the single-layer type LED shown in FIG. 2 will be described. FIG. 6 is a recipe for producing a single-layer type LED shown in FIG. 2. The production is conducted in a series of steps without taking out the sample from the reaction tube in the middle and without interrupting the growth by using a metal organic chemical vapor deposition (MOCVD, OMVPE). In FIG. 6, the upper row shows the relationship between temperature and time, and the lower row shows the supply status of each raw material.

(a) Formation of LT-GaN Layer

First, an LT-GaN layer is formed on the sapphire substrate.

Specifically, $NH_3$ as an N raw material and TMG as a Ga raw material are supplied on a sapphire substrate arranged in the reaction vessel at 500° C. for 85 seconds to form an LT-GaN layer.

(b) Formation of Ud-GaN Layer

Next, the ud-GaN layer is formed.

Specifically, first, the temperature is raised to 1180° C. During this period, only $NH_3$ is supplied.

Then, while maintaining the temperature at 1180° C., $NH_3$ and TMG are supplied for 20 minutes to form an ud-GaN layer (thickness 960 nm) on the LT-GaN layer.

(c) Formation of n-GaN Layer

Next, an n-GaN layer is formed to form a pn junction diode structure.

Specifically, while maintaining the temperature at 1180° C., $NH_3$ and TMG are supplied for 45 minutes to form n-GaN layer (thickness 2.4 µm) on the ud-GaN layer. Then-GaN layer may be formed while simultaneously supplying a Si raw material such as monomethylsilane.

(d) GaN: Formation of Tm Layer

Next, a GaN:Tm layer to be an active layer is formed.

Specifically, first, the temperature is lowered to 960° C. During this period, only $NH_3$ is supplied.

Next, while maintaining the temperature at 960° C., $NH_3$, TMG and Tm (i-PrCp)$_3$, which is a raw material for Tm, are supplied for 15 minutes to form a GaN:Tm layer (thickness 200 nm) on the n-GaN layer.

(e) Formation of p-GaN Layer

Next, a p-GaN layer is formed in order to form a pn junction diode structure.

Specifically, first, the temperature is raised to 1050° C. During this period, only $NH_3$ is supplied.

Then, while maintaining the temperature at 1050° C., $NH_3$ and TMG are supplied for 376 seconds to form p-GaN layer (thickness 120 nm) on the GaN:Tm layer. The p-GaN layer may be formed while simultaneously supplying an Mg raw material such as Cp$_2$Mg.

(f) Formation of p⁺-GaN Layer

Finally, a p⁺-GaN layer is formed in order to improve the conductivity of the p-GaN layer.

Specifically, while maintaining the temperature at 1050° C., $NH_3$ and TMG are supplied for 66 seconds to form a p⁺-GaN layer (thickness 20 nm) on the p-GaN layer. The p⁺-GaN layer may be formed while simultaneously supplying an Mg raw material such as $Cp_2Mg$.

(2) Method for Manufacturing Multi-Layer Type LED (A) First Multi-Layer Type LED First, a method for manufacturing the Tm-added GaN film shown in FIG. 3 will be described. FIG. 7 shows a recipe for preparing the Tm-added GaN film shown in FIG. 3. The production is conducted in a series of steps without taking out the sample from the reaction tube in the middle and without interrupting the growth by using a metal organic chemical vapor deposition (MOCVD, OMVPE). In FIG. 7, the upper row shows the relationship between temperature and time, and the lower row shows the supply status of each raw material.

(a) Formation of LT-GaN Layer

First, an LT-GaN layer is formed on the sapphire substrate.

Specifically, $NH_3$ as an N raw material and TMG as a Ga raw material are supplied on a sapphire substrate arranged in the reaction vessel at 500° C. for 85 seconds to form an LT-GaN layer.

(b) Formation of Ud-GaN Layer

Next, an ud-GaN layer is formed on the LT-GaN layer.

Specifically, first, the temperature is raised to 1180° C. During this period, only $NH_3$ is supplied.

Then, while maintaining the temperature at 1180° C., $NH_3$ and TMG are supplied for 30 minutes to form an ud-GaN layer (thickness 1.5 μm) on the LT-GaN layer.

(c) Formation of Active Layer

Next, an active layer in which a GaN:Tm layer and an ud-GaN layer are stacked is formed on the ud-GaN layer.

Specifically, first, the temperature is lowered to 1030° C. During this period, only $NH_3$ is supplied.

Next, while maintaining the temperature at 1030° C., $NH_3$, TMG and $Tm(i-PrCp)_3$ are supplied for 4.6 seconds to form a GaN:Tm layer (thickness 1.3 nm) on the ud-GaN layer.

Next, while maintaining the temperature at 1030° C., only $NH_3$ is supplied for 45.6 seconds to form an ud-GaN layer (thickness 13 nm) on the GaN:Tm layer.

The formation of the GaN:Tm layer and the ud-GaN layer is repeated 40 times to form an active layer in which 40 pairs of the GaN:Tm layer and the ud-GaN layer are stacked.

(d) Formation of AlN Cap Layer

Next, an AlN cap layer is formed for protection of the GaN:Tm layer and good light transmission for a He—Cd laser described later or the like.

Specifically, while maintaining the temperature at 1030° C., $NH_3$ and TMA are supplied for 60 seconds to form an AlN cap layer (thickness 20 nm) on the GaN:Tm layer.

(B) Second Multi-Layer Type LED

Next, a method for manufacturing the multilayer type LED shown in FIG. 4 will be described. FIG. 8 shows a recipe for producing the multilayer type LED shown in FIG. 4. The production is conducted in a series of steps without taking out the sample from the reaction tube in the middle and without interrupting the growth by using a metal organic chemical vapor deposition (MOCVD, OMVPE). In FIG. 8, the upper row shows the relationship between temperature and time, and the lower row shows the supply status of each raw material.

(a) Formation of LT-GaN Layer

First, an LT-GaN layer is formed on the sapphire substrate.

Specifically, $NH_3$ as an N raw material and TMG as a Ga raw material are supplied on a sapphire substrate arranged in the reaction vessel at 500° C. for 85 seconds to form an LT-GaN layer.

(b) Formation of Ud-GaN Layer

Next, an ud-GaN layer is formed on the LT-GaN layer.

Specifically, first, the temperature is raised to 1180° C. During this period, only $NH_3$ is supplied.

Then, while maintaining the temperature at 1180° C., $NH_3$ and TMG are supplied for 20 minutes to form an ud-GaN layer (thickness 960 nm) on the LT-GaN layer.

(c) Formation of n-GaN Layer

Next, an n-GaN layer is formed on top of the ud-GaN layer.

Specifically, while maintaining the temperature at 1180° C., $NH_3$ and TMG are supplied for 45 minutes to form an n-GaN layer (thickness 2.4 μm) on the ud-GaN layer. The n-GaN layer may be formed while simultaneously supplying a Si raw material such as monomethylsilane.

(d) Formation of Active Layer

Next, an active layer in which a GaN:Tm layer and a ud-GaN layer are stacked is formed on the n-GaN layer.

Specifically, first, the temperature is lowered to 1030° C. During this period, only $NH_3$ is supplied.

Next, while maintaining the temperature at 1030° C., $NH_3$, TMG and $Tm(i-PrCp)_3$ are supplied for 7.1 seconds to form a GaN:Tm layer (thickness 1.7 nm) on the n-GaN layer.

Next, while maintaining the temperature of 1030° C., only $NH_3$ is supplied for 28.4 seconds to form an ud-GaN layer (thickness 6.8 nm) on the GaN:Tm layer.

The formation of the GaN:Tm layer and the ud-GaN layer is repeated 75 times to form an active layer.

(e) Formation of p-GaN Layer

Next, a p-GaN layer is formed on the active layer.

Specifically, first, the temperature is raised to 1050° C. During this period, only $NH_3$ is supplied.

Then, while maintaining the temperature at 1050° C., $NH_3$ and TMG are supplied for 376 seconds to form a p-GaN layer (thickness 120 nm) on the GaN:Tm layer. The p-GaN layer may be formed while simultaneously supplying an Mg raw material such as $Cp_2Mg$.

(f) Formation of p⁺-GaN Layer

Finally, a p⁺-GaN layer is formed on the p-GaN layer.

Specifically, while maintaining the temperature at 1050° C., $NH_3$ and TMG are supplied for 66 seconds to form a p⁺-GaN layer (thickness 20 nm) on the p-GaN layer. The p⁺-GaN layer may be formed while simultaneously supplying an Mg raw material such as $Cp_2Mg$.

(3) Preferred Embodiment

In the production of the above-mentioned single-layer type LED and multi-layer type LED, in order to efficiently and uniformly add Tm to GaN, it is necessary to control the thermal convection of the raw material gas in the reaction apparatus, and, as described above, the growth pressure is controlled to exceed 0.01 kPa and less than 300 kPa.

The GaN:Tm layer can be manufactured by controlling the growth rate to 0.1 to 30 μm/h, but more preferably it is controlled to 0.1 to 3 μm/h.

Further, the GaN:Tm layer can be manufactured by controlling the growth temperature to 600 to 1400° C., but more preferably it is controlled to 800 to 1200° C.

Further, in the crystal growth of the GaN:Tm layer, it is preferable to reduce the supply amount of $NH_3$ more than usual. As a result, the parasitic reaction between the Tm raw material gas and $NH_3$ is suppressed, and the properties of the crystal surface (surface morphology) can be improved.

[4] Use of this Embodiment

As described above, the near-infrared light emitting semiconductor element of the present embodiment can obtain near-infrared light emission having a stable wavelength in a narrow band regardless of the operating environment. Since the near-infrared light-emitting semiconductor element of the present embodiment is As/P-free, it can be preferably applied to bioimaging, pulse oximeter, PDT, and the like as environment-friendly near-infrared light-emitting elements with little concern about implantation in the living body, and the like.

For example, a pulse oximeter, which is a medical equipment for measuring blood oxygen concentration, is composed of two types of LEDs, an LED that emits red light and an LED that emits near infrared light, and a light receiving sensor that is arranged to face the LEDs and receives light after the light emitted from the LED has passed through the fingertip (see FIG. 15). As shown in FIG. 16, blood oxygen concentration is measured by comparing the absorption difference in red light and the absorption difference in near infrared light.

For such a pulse oximeter, when a near-infrared light emitting LED using the Tm-added GaN of the present embodiment as a near-infrared light emitting LED, and an Eu-added GaN previously invented by the present inventors as a red-light emitting LED are used, it is possible to provide a pulse oximeter in which the measurement error is suppressed to the utmost limit since any of the LEDs can emit light with a stable wavelength in a narrow band.

EXAMPLE

[1] Experiment 1

In this experiment, two types (Experimental Example 1 and Experimental Example 2) of the single-layer type LED shown in FIG. 1 (before electrode fabrication) were produced by changing the growth temperature of the active layer and the flow rate (supply rate) of $NH_3$. The light emission performance of each was evaluated based on the light transmitted through the AlN cap layer.

1. Manufacturing of LED

Table 1 shows the manufacturing specifications of the LEDs. Also, the recipe for producing is shown in FIG. 5.

TABLE 1

| | Experimental Example 1 | Experimental Example 2 |
|---|---|---|
| How to grow | OMVPE method | OMVPE method |
| Growth pressure | 10 kPa (active layer) | 10 kPa (active layer) |
| Growth temperature | 1030° C. (active layer) | 960° C. (active layer) |
| Growth rate | 0.86 μm/h (active layer) | 0.80 μm/h (active layer) |
| Used substrate | Single-sided polishing c-side sapphire substrate | Single-sided polishing c-side sapphire substrate |
| Ga raw material (flow rate) | TMG (25.6 μmol/min.) | TMG (25.6 μmol/min.) |
| N raw material (flow rate) | $NH_3$ (44.6 mmol/min.) | $NH_3$ (178.6 mmol/min.) |
| Tm raw material (flow rate) | Tm(i-PrCp)$_3$ (85.9 nmol/min.) | Tm(i-PrCp)$_3$ (85.9 nmol/min.) |

2. Evaluation (1) PL Strength

First, each of the obtained LEDs was subjected to optical evaluation (PL intensity).

Specifically, the PL (photoluminescence) intensity was measured at room temperature using a He—Cd laser having an output of 1.0 mW. The results are shown in FIG. 9. In FIG. 9, the vertical axis represents the PL intensity and the horizontal axis represents the wavelength.

From FIG. 9, it can be seen that in Experimental Example 1, the peak intensity appearing in the vicinity of the wavelength of 800 nm is 3.3 times that in Experimental Example 2. Further, it can be seen that near-infrared rays are emitted in a narrow band width in Experimental Example 1 as compared with Experimental Example 2.

From this result, it can be seen that the emission intensity is improved by raising the growth temperature of the active layer (960° C.→1030° C.) to promote thermal diffusion of atoms on the substrate and reducing the flow rate (supply rate) of $NH_3$ (178.6 mmol/min.→44.6 mmol/min.) to suppress the parasitic reaction.

(2) Surface Morphology

Next, the surface of the active layer in Experimental Example 1 whose optical evaluation was good was observed with a Nomalski microscope, and the surface morphology was evaluated. The results are shown in FIG. 10.

From FIG. 10, it can be seen that a relatively good surface morphology is formed on the surface of the active layer in Experimental Example 1 without major roughness.

[2] Experiment 2

In this experiment, as the LED of Experimental Example 3, the multi-layer type LED shown in FIG. 3 corresponding to the single-layer type LED in Experiment 1 was produced according to the production recipe shown in FIG. 7, and its light emission performance was evaluated. The results are shown in FIG. 11. In FIG. 11, the results of Experimental Examples 1 and 2 are also shown, in addition.

From FIG. 11, it can be seen that, in Experimental Example 3, the peak intensity appearing near the wavelength of 800 nm is 4.8 times that of Experimental Example 1, and 15.8 times (=3.3×4.8) that of Experimental Example 2.

From this result, it can be seen that stable near-infrared emission and further improvement in emission intensity can be achieved by stacking a plurality of pairs of the GaN:Tm layer and the ud-GaN layer as a pair to form an active layer.

[3] Experiment 3

In this experiment, a multi-layer type LED in which the active layer was further formed in multiple layers was produced as compared with the LED of Experimental Example 3, and the light emission performance was evaluated by electroluminescence (EL).

Specifically, based on the production recipe shown in FIG. 8, the light emitting layer is formed by stacking 75 pairs of a GaN:Tm layer having a thickness of 1.7 nm and an ud-GaN layer having a thickness of 6.8 nm as one pair, and a multi-layer type LED shown in 4 as the LED of Experimental Example 4 was produced.

Then, using the obtained LED, the mountable LED shown in FIG. 12 was manufactured.

Specifically, a Ti/Au ohmic electrode was formed by electron beam vapor deposition on the n-GaN layer exposed by the dry etching method. Similarly, a Ni/Au ohmic electrode was formed on the p+-GaN layer by electron beam deposition to obtain a mountable LED.

Then, using this mountable LED, the injection current was changed in four stages of 0.1 mA, 0.5 mA, 1.5 mA, and 3.5 mA to emit light, and the EL intensity was measured. The results are shown in FIG. 13. In FIG. 13, the vertical axis represents the EL emission intensity and the horizontal axis represents the wavelength.

From FIG. 13, it can be seen that near infrared rays are emitted with a narrow band width in the vicinity of a wavelength of 800 nm at any injection current, and that the emission wavelength does not depend on the injection current and is stable. Then, it can be seen that the EL strength becomes stronger as the injection current increases.

[4] Experiment 4

In this experiment, the relationship between the EL intensity and the injection current was investigated for the single-layer type LED of Experimental Example 1 produced in Experiment 1 and the multi-layer type LED of Experimental Example 4 produced in Experiment 3.

The results are shown in FIG. 14. In FIG. 14, the vertical axis represents the EL intensity and the horizontal axis represents the current. Further, FIG. 14 shows the relationship between the EL intensity (vertical axis) and the wavelength (horizontal axis) when the two LEDs are made to emit light with an injection current of 3.5 mA.

From FIG. 11, it can be seen that the multi-layer type LED of Experimental Example 4 has a stronger EL intensity than the single-layer type LED of Experimental Example 1, even with the same injection current, and the difference increases as the injection current increases.

From this result, it can be seen that extremely excellent light emission performance can be obtained by using the multi-layer type LED.

Although the present invention has been described above based on the embodiments, the present invention is not limited to the above embodiments, and various changes can be added to the embodiments described above within the same and equivalent range as the present invention.

DESCRIPTION OF THE REFERENCE NUMERALS 21 p+-GaN layer
22 p-GaN layer
23 AlN cap layer
30 GaN:Tm layer
31, 55 ud-GaN layer
40 n-GaN layer
56 LT-GaN layer
90 sapphire substrate

What is claimed is:

1. A method for manufacturing a near-infrared light emitting semiconductor element, which emits light with three dominant peaks between wavelength of 790 nm and 820 nm by a transition in the 4f shell of Tm3+ ions electrically excited by a current injection, wherein
an active layer obtained by adding Tm to replace the Ga in GaN by supplying TMG, NH3, and Tm(i-PrCp)$_3$ together and controlling a substitution site of Tm$^{3+}$ ion so that it is in the Ga site or its immediate vicinity is formed at a growth rate of 1 to 30 μm/h in a reaction vessel without removing it from the reaction vessel, using a metal organic chemical vapor deposition, under the temperature condition of 600-1400° C., in a series of forming steps of a p-type layer and an n-type layer.

2. The method for manufacturing a near-infrared light emitting semiconductor element according to claim 1, wherein the amount of Tm added is $1 \times 10^{12}$ to $1 \times 10^{23}$ cm$^{-3}$.

3. The method for manufacturing a near-infrared light emitting semiconductor element according to claim 1, wherein the active layer is formed by stacking a plurality of the Tm-added GaN layer and the Tm-free GaN layer as a pair.

4. The method for manufacturing a near-infrared light emitting semiconductor element according to claim 1, wherein
the growth pressure of the active layer in a metal organic chemical vapor deposition exceeds 0.01 kPa and is less than 300 kPa.

5. The method for manufacturing a near-infrared light emitting semiconductor element according to claim 1, wherein the flow rate of a carrier gas in a metal organic chemical vapor deposition used for forming the active layer is 10 to 300 SLM.

6. The method for manufacturing a near-infrared light emitting semiconductor element according to claim 2, wherein the active layer is formed by stacking a plurality of the Tm-added GaN layer and the Tm-free GaN layer as a pair.

7. The method for manufacturing a near-infrared light emitting semiconductor element according to claim 2, wherein the growth pressure of the active layer in the metal organic chemical vapor deposition exceeds 0.01 kPa and is less than 300 kPa.

8. The method for manufacturing a near-infrared light emitting semiconductor element according to claim 3, wherein the growth pressure of the active layer in the metal organic chemical vapor deposition exceeds 0.01 kPa and is less than 300 kPa.

9. The method for manufacturing a near-infrared light emitting semiconductor element according to claim 2, wherein the flow rate of the carrier gas in the metal organic chemical vapor deposition used for forming the active layer is 10 to 300 SLM.

10. The method for manufacturing a near-infrared light emitting semiconductor element according to claim 3, wherein the flow rate of the carrier gas in the metal organic chemical vapor deposition used for forming the active layer is 10 to 300 SLM.

11. The method for manufacturing a near-infrared light emitting semiconductor element according to claim 4, wherein the flow rate of the carrier gas in the metal organic chemical vapor deposition used for forming the active layer is 10 to 300 SLM.

12. A method for manufacturing a near-infrared light emitting semiconductor element, wherein
an active layer obtained by adding Tm to replace the Ga in GaN by supplying TMG, NH3, and Tm(i-PrCp)3 together and controlling a substitution site of Tm3+ ion so that it is in the Ga site or its immediate vicinity is formed in a reaction vessel without removing it from the reaction vessel, using a metal organic chemical vapor deposition, under the temperature condition of 600-1400° C., in a series of forming steps of a p-type layer and an n-type layer, wherein the active layer is formed by stacking a plurality of pairs consisting of a Tm-added GaN layer, formed at a growth rate of 1 to 30 μm/h, and a Tm-free GaN layer, which is thicker than the Tm-added GaN layer.

\* \* \* \* \*